United States Patent

Aoyama et al.

[11] Patent Number: 5,175,078
[45] Date of Patent: Dec. 29, 1992

[54] POSITIVE TYPE PHOTORESIST DEVELOPER

[75] Inventors: Tetsuo Aoyama; Susumu Kaneko, both of Niigata, Japan

[73] Assignee: Mitsubishi Gas Chemical Company, Inc., Tokyo, Japan

[21] Appl. No.: 857,076

[22] Filed: Mar. 18, 1992

Related U.S. Application Data

[63] Continuation of Ser. No. 668,344, Mar. 11, 1991, abandoned, which is a continuation of Ser. No. 416,493, Oct. 3, 1989, abandoned.

[30] Foreign Application Priority Data

Oct. 20, 1988 [JP] Japan .................. 63-262687
Oct. 21, 1988 [JP] Japan .................. 63-264090

[51] Int. Cl.⁵ .................................. G03F 7/32
[52] U.S. Cl. ........................ 430/331; 430/165; 430/192; 430/326; 430/330; 252/405
[58] Field of Search ............ 430/331, 330, 326, 192, 430/165; 252/541, 50, 389.62, 394, 405

[56] References Cited

U.S. PATENT DOCUMENTS

| | | | |
|---|---|---|---|
| 3,255,004 | 6/1966 | Thommes | 96/35 |
| 4,374,920 | 2/1983 | Wanat et al. | 430/331 |
| 4,576,903 | 3/1986 | Baron et al. | 430/331 |
| 4,784,937 | 11/1988 | Tanaka et al. | 430/331 |
| 4,820,621 | 4/1989 | Tanaka et al. | 430/331 |

FOREIGN PATENT DOCUMENTS

| | | |
|---|---|---|
| 0124297 | 11/1984 | European Pat. Off. |
| 0146834 | 7/1985 | European Pat. Off. |
| 0132354 | 7/1986 | European Pat. Off. |
| 0336400 | 10/1989 | European Pat. Off. |
| 3223386 | 2/1983 | Fed. Rep. of Germany |

OTHER PUBLICATIONS

Chemical Abstracts, vol. 109, No. 8, Aug. 22, 1988, p. 657 Abstract No. 64360u, Columbus, Ohio, US; & JP-A-63 63 643 (Tama Kagaku Kogyo K.K.; Moses Lake Industries, Inc.) Mar. 22, 1988.

Chemical Abstracts, vol. 110, No. 26, Jun. 26, 1989, p. 659, Abstract No. 241174e, Columbus, Ohio, US; & JP-A-01 14 924 (Mitsubishi Gas Chemical Co., Inc.) Jan. 19, 1989.

*Primary Examiner*—Charles L. Bowers, Jr.
*Assistant Examiner*—John S. Y. Chu
*Attorney, Agent, or Firm*—Frishauf, Holtz, Goodman & Woodward

[57] ABSTRACT

A positive type photoresist developer which comprises an aqueous solution of quaternary ammonium hydroxide represented by the general formula;

$$\left( \begin{array}{c} R^1 \\ | \\ R^2-N-R^4 \\ | \\ R^3 \end{array} \right)^{-} \cdot OH^{-} \quad (I)$$

(wherein all the symbols are as defined in the appended claims) and hydrazine or hydrazine and a nonionic surfactant is disclosed.

The developer can form a fine pattern having a high degree of resolution and can provide an excellent profile with few irregularities in pattern dimensions.

22 Claims, No Drawings

POSITIVE TYPE PHOTORESIST DEVELOPER

This application is a continuation of application Ser. No. 7/668,344, filed Mar. 11, 1991 (abandoned), which is a continuation of application Ser. No. 07/416,493, filed Oct. 3, 1989 (abandoned).

BACKGROUND OF THE INVENTION

1. Filed of the Invention

The present invention relates to a positive type photoresist developer and more particularly to a photoresist developer comprising an aqueous solution of quaternary ammonium hydroxide containing hydrazine or hydrazine and a nonionic surfactant. Especially it relates to a positive type resist developer which enables the formation of a fine pattern having a high degree of resolution (high resolving power) and can provide an excellent profile with few irregularities in pattern dimensions, and thus which is useful for production of semiconductor integrated circuits and so forth.

2. Description of the Related Arts

With the marked development of the electronic industry in recent years, the semiconductor integrated circuit has increased in the degree of integration as exemplified by a super LSI, and the minimum line width in drawing a circuit is more decreased. Under such circumstances, it has been strongly desired to form a resist pattern with high fidelity. Only a positive type resist can meet the above requirements and moreover it is superior in degree of resolution to the conventionally used negative type resist. A typical positive type resist contains an alkali-soluble novolak resin and a naphthoquinonediazide compound as a photo-decomposable agent.

In this positive type resist containing a naphthoquinonediazide compound, an aqueous alkali solution is used as a developer. In the production of semiconductor integrated circuit devices, it is undesirable to use an aqueous alkali solution containing metal ions as a developer. For this reason, a developer of organic alkali not containing metal ions, for example, an aqueous solution of tetramethylammonium hydroxide (IBM, Technical Disclosure Bulettin, Vol. 13, No. 7, p. 2009(1970)) or choline (U.S. Pat. No. 4,239,661) is generally used.

However, in the drawing of a pattern with a fine line width using a developer of, e.g., tetramethylammonium hydroxide or choline, a resist profile and a dimension controlling accuracy are extremely decreased. Thus, in order to increase resist accuracy, an alkali concentration of a developer is increased, or a developer temperature is increased, or a developing time is lengthened. However, no sufficient effect for so-called through put can be obtained. As an improved technique to increase a degree of resolution, it is proposed to add various surfactants or organic compounds to an aqueous solution of quaternary ammonium hydroxide. Addition of surfactants is disclosed in Japanese Patent Application Laid-Open Nos. 9143/1983, 70551/1986, 151537/1986, 16748/1986, 232453/1986, 232454/1986, 32452/1987, 32454/1987, 47125/1987, etc. Addition of surfactants and organic compounds such as alcohols and hydrocarbons is disclosed in Japanese Patent Application Laid-Open Nos. 232453/1987, 57128/1983, etc. Addition of other organic compounds are disclosed in Japanese Patent Application Laid-Open Nos. 24105/1985, 38755/1987, 57162/1987, 67535/1987, etc. However, these aqueous solutions have advantages and disadvantages, and cannot always be satisfactory in degree of resolution, dimensional accuracy and so forth in lithography of fine line width patterns.

In order to increase storage stability of an aqueous choline solution and to prevent coloration thereof, an aqueous solution obtained by adding hydrazine to an aqueous choline solution has been proposed (Japanese Patent Application Laid-Open No. 63643/1988).

The present inventors have disclosed that an aqueous solution prepared by mixing an aqueous solution of quaternary ammonium hydroxide with hydrazine and a surfactant is useful for a washing solution for wafers (Japanese Patent Application No. 169653/1987). As a result of a further study on a positive type photoresist developer capable of providing a profile which is of high degree of resolution, is decreased in irregularities in pattern dimensions, and is high in accuracy, it has been found that addition of hydrazine or hydrazine and a nonionic surfactant to an aqueous quaternary ammonium hydroxide solution as an aqueous organic alkali solution enables the formation a fine pattern with high accuracy. The present invention has been accomplished based on the findings herein.

SUMMARY OF THE INVENTION

An object of the present invention is to provide a positive type photoresist developer which enables the obtainment of an excellent resist profile which is of high degree of resolution and which enables the formation a fine pattern with few irregularities in pattern dimensions.

Another object of the present invention is to provide a positive type photoresist developer which sufficiently controls a film thickness decreasing rate of an unexposed area, thereby enabling the obtainment of an excellent profile, and which enables to form a fine pattern with few irregularities in pattern dimensions and is of high degree of resolution or high resolving power.

The present invention relates to a positive type photoresist developer which comprises an aqueous solution of quaternary ammonium hydroxide represented by the general formula (I):

(wherein $R^1$ to $R^4$ may be identical or different and are independently an alkyl group having 1 to 4 carbon atoms or an aryl group) and hydrozine. The aqueous solution constituting the photoresist developer can contain a nonionic surfactant.

DESCRIPTION OF THE PREFERRED EMBODIMENTS

In the developer of the present invention, specific examples of the quaternary ammonium hydroxide represented by the above general formula (I) are tetramethylammonium hydroxide, tetraethylammonium hydroxide, trimethylbutylammonium hydroxide, and trimethylphenylammonium hydroxide. Particularly preferred quaternary ammonium hydroxide is tetramethylammonium hydroxide.

The developer of the present invention can be prepared by adding hydrazine or hydrazine and a nonionic surfactant to an aqueous solution of quaternary ammonium hydroxide represented by the general formula (I).

The concentration of the aqueous solution of the quaternary ammonium hydroxide to be used in the present invention is 0.5 to 10% by weight and preferably 1 to 6% by weight.

In the present invention, the concentration of hydrazine can be determined in the range of 50 to 5,000 ppm; it is preferably in the range of 100 to 1,500 ppm and more preferably in the range of 250 to 1,000 ppm. If the concentration of hydrazine is less than 50 ppm, no sufficient effect can be obtained. On the other hand, if it is more than 5,000 ppm, selective solubility between an exposed area and an unexposed area is markedly decreased, leading to a deterioration in the shape of the resist after development, and thus the desired resist pattern is difficult to obtain.

Preferable nonionic surfactants to be used in the present invention are a polyoxyethylene alkyl ether type nonionic surfactant represented by the general formula (A):

(wherein R is an alkyl group having 6 to 18 carbon atoms and n is 8 to 15), a polyoxyethylene aryl ether type nonionic surfactant represented by the general formula (B):

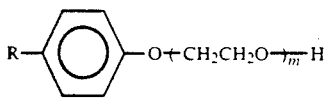

(wherein R is an alkyl group having 6 to 18 carbon atoms and m is 5 to 30), and a polyoxyethylene alkyl ester type nonionic surfactant represented by the general formula (C):

(wherein R is an alkyl group having 6 to 18 carbon atoms and l is 5 to 30) are suitably used.

Representative examples of the polyoxyethylene alkyl ether type nonionic surfactant represented by the general formula (A) are polyoxyethylene oleyl ether (trade name: NOIGEN ET-140E (produced by Dai-Ichi Kogyo Seiyaku Co., Ltd.); trade name: EMULGEN 430 (produced by Kao Co., Ltd.), etc.), and polyoxyethylene lauryl ether (trade name: NOIGEN ET-160 (produced by Dai-Ichi Kogyo Seiyaku Co., Ltd.); trade name: EMULGEN 120 (produced by Kao Co., Ltd.)etc.).

Representative examples of the polyoxyethylene aryl ether type nonionic surfactant represented by the general formula (B) are polyoxyethylene nonylphenyl ether (trade name: NOIGEN EP-130A (produced by Dai-Ichi Kogyo Seiyaku Co., Ltd.), trade name: EMULGEN 909 (produced by Kao Co., Ltd.), etc.), and polyoxyethylene octylphenyl ether (trade name: NOIGEN EA-142 (produced by Dai-Ichi Kogyo Seiyaku Co., Ltd.); trade name: EMULGEN 810 (produced by Kao Co., Ltd.), etc.).

Representative examples of the polyoxyethylene alkyl ester type nonionic surfactant represented by the general formula (C) are polyoxyoleate (trade name: NOIGEN ES-149 (produced by Dai-Ichi Kogyo Seiyaku Co., Ltd.); trade name: EMANON 4110 (produced by Kao Co., Ltd.), etc.), and polyoxystearate (trade name: NOIGEN DS-60 (produced by Dai-Ichi Kogyo Co., Ltd.); trade name: EMANON 3119 (produced by Kao Co., Ltd.)).

The surfactant is generally used in a concentration of 10 to 5,000 ppm. Usually, within a concentration range of 100 to 1,000 ppm, the effect can be sufficiently obtained.

If the amount of the surfactant added is less than 10 ppm, wetting properties are poor and a film reduction of an unexposed area is undesirably increased. On the other hand, if it is more than 5,000 ppm, the surfactant remains on a wafer after development, undesirably increasing the rinsing amount at the succeeding step.

A positive resist to which the developer of the present invention is applied is not critical. For example, a positive resist containing an alkali-soluble novolak resin such as a m-cresol-novolak resin and a naphthoquinonediazide compound as constituting components can be used.

The developer of the present invention can sufficiently control a film thickness decreasing rate of an unexposed area, enabling the formation a fine pattern with a high degree of resolution, and moreover can provide an excellent profile which is decreased in unevenness of pattern dimensions. Furthermore the developer of the present invention has advantages, for example, in that no scum is observed, and thus it is suitable for practical use.

The present invention is described in greater detail with reference to the following examples, although it is not limited thereto.

EXAMPLE 1

Hydrazine in the amount shown in Table 1 was added to a 2.38 wt % aqueous solution of tetramethylammonium hydroxide (TMAH) to prepare a developer. For comparison, developers not containing hydrazine were prepared and tested. In addition, choline ([HOCH$_2$CH$_2$N(CH$_3$)$_3$]+OH− (trimethylhydroxyethylammonium hydroxide)) was tested.

OFPR-800 (produced by Tokyo Ohka Kogyo Co., Ltd.) containing an alkali-soluble novolak resin and a naphthoquinonediazide compound as constituting components was coated on a 3 inch silicon wafer in a film thickness of 1.2 μm by the use of a spiner, prebaked at 80° C. for 20 minutes in a clean oven, and then exposed to light through a test chart pattern by the use of a contact light exposure apparatus.

After development at 23° C. for 60 seconds according to a dipping method using the developer shown in Table 1, the coated wafer was rinsed with ultra-pure water and then dried. A film thickness decreasing rate of the resist film in the unexposed area, a taper angle of a cross section of a resist pattern after development, and the state of scum were measured or observed. The taper angle of resist pattern was determined by observing the cross-sectional shape of the developed resist film with a scanning type electron microscope, and the state of the scum was determined by observing the state of the developed substrate with a scanning type electron microscope.

TABLE 1

| Run No. | TMAH Concentration (wt %) | Hydrazine Concentration (ppm) | Film Thickness Decreasing Rate in Unexposed Area (Å/min) | Resist Taper Angle (°) | State of Scum** |
| --- | --- | --- | --- | --- | --- |
| 1 | 2.38 | 250 | 790 | 73 | ○ |
| 2 | 2.38 | 500 | 820 | 75 | ○ |
| 3 | 2.38 | 1000 | 890 | 78 | ○ |
| 4 | 2.38 | — | 1010 | 60 | X or Δ |
| 5 | 2.38 | 10 | 890 | 60 | Δ |
| 6 | 5.00* | 1000 | 850 | 70 | Δ |

*Choline concentration is shown instead of TMAH concentration.
**○: No scum was observed. Δ: A little scum was observed. X: Scum was observed.

EXAMPLE 2

Hydrazine and a polyoxyethylene aryl ether type nonionic surfactant (trade name: NOIGEN EP-130A produced by Dai-Ichi Kogyo Seiyaku Co., Ltd.) in the amounts shown in Table 2 were added to a 2.38 wt % aqueous solution of tetramethylammonium hydroxide (TMAH) to prepare a developer. OFPR-800 (produced by Tokyo Ohka Kogyo Co., Ltd.) containing an alkali-soluble novolak resin and a naphthoquinonediazide compound as constituting components was coated on a 3 inch silicon wafer in a film thickness of 1.2 μm by the use of a spiner, prebaked at 80° C. for 20 minutes in a clean oven, and then exposed to light through a test chart pattern by the use of a contact light exposure apparatus.

After development at 23° C. for 60 seconds according to a dipping method using the developer shown in Table 2, the coated wafer was rinsed with super fine water and then dried. A film thickness decreasing rate of an unexposed area, a taper angle of the cross-sectional shape of a resist pattern after development, and the state of scum were measured or observed. The cross-sectional shape of the developed resist film and the state of scum were observed in the same manner as in Example 1 by the use of a scanning type electron microscope. The results are shown in Table 2.

TABLE 2

| Run No. | TMAH Concentration (wt %) | Hydrazine Concentration (ppm) | Surfactant Concentration (ppm) | Film Thickness Decreasing Rate in Unexposed Area (Å/min) | Resist Taper Angle (°) | State of Scum** |
| --- | --- | --- | --- | --- | --- | --- |
| 7 | 2.38 | 1000 | 250 | 790 | 78 | ○ |
| 8 | 2.38 | 1000 | 500 | 750 | 80 | ○ |
| 9 | 2.38 | 500 | 500 | 700 | 80 | ○ |
| 10 | 2.38 | 100 | 500 | 610 | 75 | ○ |
| 11 | 2.38 | — | — | 1010 | 60 | X-Δ |
| 12 | 2.38 | — | 250 | 950 | 65 | Δ |
| 13 | 5.00* | 1000 | 500 | 730 | 65 | Δ |

*Choline concentration is shown instead of TMAH concentration.
**○: No scum was observed. Δ: A little scum was observed. X: Scum was observed.

EXAMPLE 3

The procedure of Example 2 was repeated with the exception using a developer containing a polyoxyethylene alkyl ether type nonionic surfactant (trade name: NOIGEN ET-140E produced by Dai-Ichi Seiyaku Kogyo Co., Ltd.) as a nonionic surfactant and 100 ppm or 500 ppm of hydrazine. The test results are shown in Table 3.

TABLE 3

| Run No. | TMAH Concentration (wt %) | Hydrazine Concentration (ppm) | Surfactant Concentration (ppm) | Film Thickness Decreasing Rate in Unexposed Area (Å/min) | Resist Taper Angle (°) | State of Scum |
| --- | --- | --- | --- | --- | --- | --- |
| 14 | 2.38 | 500 | 500 | 740 | 80 | ○ |
| 15 | 2.38 | 100 | 500 | 680 | 74 | ○ |

EXAMPLE 4

As nonionic surfactants, a polyoxyethylene alkyl ether type surfactant (trade name: NOIGEN ET-140E (polyethylene glycol monooleyl ether) produced by Dai-Ichi Kogyo Seiyaku Co., Ltd.) and a polyoxyethylene alkyl ester type surfactant (trade name: NOIGEN ES149 (polyethylene glycol monostearate) produced by Dai-Ichi Kogyo Seiyaku Co., Ltd.) were used, and a developer containing 1,000 ppm of hydrazine and 500 ppm of the surfactants was prepared and used. In Run Nos. 18 and 19, the TMAH concentrations were 2.27 wt % and 1.42 wt %, respectively. In Run No. 19, the developing time was 120 seconds. The others were carried out in the same manner as in Example 2. The results are shown in Table 4.

TABLE 4

| Run No. | TMAH Concentration (wt %) | Hydrazine Concentration (ppm) | Surfactant Concentration (ppm) | Film Thickness Decreasing Rate in Unexposed Area (Å/min) | Resist Taper Angle (°) | State of Scum |
| --- | --- | --- | --- | --- | --- | --- |
| 16 | 2.38 | 1000 | 500 | 740 | 80 | ○ |
| 17 | 2.38 | 1000 | 500 | 750 | 80 | ○ |
| 18 | 2.27 | 1000 | 500 | 740 | 78 | ○ |
| 19 | 1.42 | 1000 | 500 | 700 | 75 | ○ |

EXAMPLE 5

Hydrazine and a polyoxyethylene aryl ether type nonionic surfactant (trade name: NOIGEN EP-130A produced by Dai-Ichi Kogyo Seiyaku Co., Ltd.) were added to a 6.00 wt % aqueous solution of tetraethylammonium hydroxide (TEAH) to prepare a developer containing 1000 ppm of hydrazine and 500 ppm of the surfactant.

The procedure of Example 2 was repeated with exception that the developer thus obtained was used.

The film thickness decreasing rate of the resist film in the unexposed area was 790 Å/min. The taper angle of resist pattern was 73 degrees and the scum was not observed.

What is claimed is:

1. A positive type photoresist developer which comprises (a) an aqueous solution of a quaternary ammonium hydroxide of the formula (I):

wherein $R^1$ to $R^4$ are identical or different and are independently an alkyl group having 1 to 4 carbon atoms and (b) hydrazine, wherein the concentration of hydrazine is 50 to 5,000 ppm and the concentration of the quaternary ammonium hydroxide is 1 to 6% by weight.

2. A positive type photoresist developer which comprises (a) an aqueous solution of quaternary ammonium hydroxide of the formula (I):

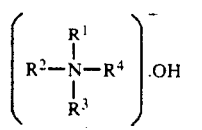

wherein $R^1$ to $R^4$ are identical or different and are independently an alkyl group having 1 to 4 carbon atoms, and (b) hydrazine and (c) at least one nonionic surfactant selected from the group consisting of a polyoxyethylene alkyl ether type nonionic surfactant of the formula:

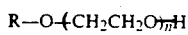

wherein R is an alkyl group having 6 to 18 carbon atoms and n is 8 to 15, a polyoxyethylene aryl ether type nonionic surfactant of the formula:

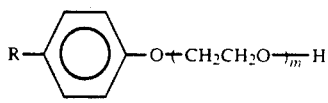

wherein R is an alkyl group having 6 to 18 carbon atoms and m is 5 to 30, and a polyoxyethylene alkyl ester type nonionic surfactant of the formula:

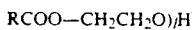

wherein R is an alkyl group having 6 to 18 carbon atoms and l is 5 to 30, wherein the concentration of the quaternary ammonium hydroxide is 1 to 6% by weight, the concentration of hydrazine is 50 to 5000 ppm and the concentration of the nonionic surfactant is 10 to 5000 ppm.

3. The developer as defined in claim 1 or 2 wherein the quaternary ammonium hydroxide is tetraalkylammonium hydroxide having four alkyl groups with 1 to 4 carbon atoms.

4. The developer as defined in claim 1 or 2 wherein the quaternary ammonium hydroxide is at least one compound selected from the group consisting of tetramethylammonium hydroxide, tetraethylammonium hydroxide and trimethylbutylammonium hydroxide.

5. The developer as defined in claim 1 or 2 wherein the quaternary ammonium hydroxide is tetramethylammonium hydroxide or tetraethylammonium hydroxide.

6. The developer as defined in claim 2 wherein the concentration of the nonionic surfactant is 100 to 1,000 ppm.

7. The developer as defined in claim 1 or 2 wherein the concentration of hydrazine is 100 to 1,500 ppm.

8. The developer as defined in claim 1 or 2 wherein the concentration of hydrazine is 250 to 1,000 ppm.

9. A process for producing the developer as defined in claim 1, which comprises adding hydrazine to an aqueous solution of quaternary ammonium hydroxide of the formula (I).

10. A process for producing the developer as defined in claim 2, which comprises adding hydrazine and a nonionic surfactant to an aqueous solution of quaternary ammonium hydroxide of the formula (I).

11. The developer as defined in claim 2, wherein the nonionic surfactant is selected from the group consisting of polyoxyethylene oleyl ether, polyoxyethylene lauryl ether, polyoxyethylene nonylphenyl ether, polyoxyethylene octylphenyl ether, polyoxyoleate and polyoxystearate.

12. The developer as defined in claim 1 in combination with an alkali-soluble novolak resin and a naphthoquinonediazide compound.

13. The developer as defined in claim 2 in combination with an alkali-soluble novalak resin and a naphthoquinonediazide compound.

14. The developer as defined in claim 2, wherein the nonionic surfactant is selected from the group consisting of polyoxyethylene oleyl ether, polyoxyethylene lauryl ether, polyoxyethylene nonylphenyl ether, polyoxyethylene octylphenyl ether, polyoxyoleate and polyoxystearate, the concentration of the hydrazine is 250 to 1,000 ppm, the concentration of the quaternary ammonium hydroxide is 1 to 6% by weight and the concentration of the nonionic surfactant is 100 to 1,000 ppm.

15. The developer as defined in claim 1, wherein the concentration of said quaternary ammonium hydroxide is 1 to 6% by weight and the concentration of said hydrazine is 250 to 1,000 ppm.

16. The developer as defined in claim 14 wherein the quaternary ammonium hydroxide is tetramethylammonium hydroxide.

17. The developer as defined in claim 15 wherein the quaternary ammonium hydroxide is tetramethylammonium hydroxide.

18. The developer as defined in claim 14, wherein the quaternary ammonium hydroxide is tetraethylammonium hydroxide.

19. The developer as defined in claim 15, wherein the quaternary ammonium hydroxide is tetraethylammonium hydroxide.

20. The developer as defined in claim 16, wherein the nonionic surfactant is selected from the group consisting of polyethylene glycol monooleyl ether and polyethene glycol monostearate.

21. The developer as defined in claim 1, wherein the concentration of the quaternary ammonium hydroxide is 2.30% by weight.

22. The developer as defined in claim 2, wherein the concentration of the quaternary ammonium hydroxide is 2.30% by weight.

* * * * *